United States Patent [19]

Yamada et al.

[11] Patent Number: 4,583,225
[45] Date of Patent: Apr. 15, 1986

[54] REED-SOLOMON CODE GENERATOR

[75] Inventors: Yasuhiro Yamada, Fusa; Harukuni Kobari, Yokohama; Hiroyuki Saito, Tokyo; Kohbun Sakagami, Sagamihara; Kaoru Kobayashi, Yokohama, all of Japan

[73] Assignee: Victor Company of Japan, Limited, Kanagawa, Japan

[21] Appl. No.: 541,402

[22] Filed: Oct. 13, 1983

[30] Foreign Application Priority Data

Oct. 20, 1982 [JP] Japan .................................. 57-184380

[51] Int. Cl.⁴ .............................................. G06F 11/10
[52] U.S. Cl. .......................................... 371/37; 371/39
[58] Field of Search ............................. 371/30, 37–42, 371/53–54; 375/10, 25–26

[56] References Cited

U.S. PATENT DOCUMENTS

| | | | |
|---|---|---|---|
| 4,162,480 | 6/1979 | Berlekamp | 371/37 X |
| 4,271,517 | 6/1981 | Krauss | 371/37 |
| 4,330,860 | 5/1982 | Wada et al. | 371/37 |
| 4,410,989 | 10/1983 | Berlekamp | 371/40 |
| 4,413,340 | 11/1983 | Odaka et al. | 371/39 |
| 4,441,184 | 4/1984 | Sonoda et al. | 371/40 |

Primary Examiner—Gary V. Harkcom
Attorney, Agent, or Firm—Jordan and Hamburg

[57] ABSTRACT

A Reed-Solomon code generator applicable to a digital signal recording/playback apparatus checks or corrects code errors in digital signals. The code generator eliminates the need for costly read only memory devices (ROM tables) and uses inexpensive registers, modulo 2 adders and multipliers instead.

13 Claims, 3 Drawing Figures

REED-SOLOMON CODE GENERATOR

BACKGROUND OF THE INVENTION

The present invention relates to a Reed-Solomon code generator and, more particularly, to one which finds various applications such as to pulse code modulation (PCM) recording/playback apparatuses, on which audio video and other information signals are digitally processed, employing magnetic tapes or discs, and to other digital signal recording/playback apparatuses for checking or correcting code errors caused in the digital signals processed in the apparatuses.

The principle of Reed-Solomon code generation which prior art generators have employed will be described first.

Assume that parity words P and Q are generator for "k" externally derived data words $W_1$-$W_k$, and that $(k+2, k)$ Reed-Solomon codes are prepared with $W_1$-$W_k$, P and Q. Also, assume that the parity matrix for Reed-Solomon codes is $$\begin{pmatrix} 1, & 1, & 1 & \ldots & \ldots 1, & 1 \\ \alpha^{k+1}, & \alpha^k, & \alpha^{k-1} & \ldots & \ldots \alpha, & 1 \end{pmatrix} \begin{pmatrix} W_1 \\ W_2 \\ \cdot \\ W_k \\ P \\ Q \end{pmatrix} = \begin{pmatrix} S_0 \\ S_1 \end{pmatrix}$$

where $\alpha$ is the primitive root of a predetermined polynomial, and $[S_0, S_1]^T$ is the syndrome (T indicates displacement of matrix). Therefore, when k=14 for example, and if all the external data words and parity words $W_1, W_2, \ldots, W_{14}$, P and Q are correct, the Reed-Solomon code parity matrix $$H_0 = \begin{pmatrix} 1, & 1, & 1 & \ldots & \ldots 1, & 1, & 1 \\ \alpha^{15}, & \alpha^{14}, & \alpha^{13} & \ldots & \ldots \alpha^2, & \alpha, & 1 \end{pmatrix}$$

is expressed as $$S_0 = W_1 + W_2 + \ldots + W_{14} + P + Q = 0$$

$$S_1 = \alpha^{15} \cdot W_1 + \alpha^{14} \cdot W_2 \ldots \alpha \cdot P + Q = 0$$

Even when the check matrix is modified (multiplying one row by a constant and adding the product to another row), the resulting matrix $$H_0 = \begin{pmatrix} \alpha^{x1}, & \alpha^{x2} & \ldots & \ldots \alpha^{x14}, & 1, & 0 \\ \alpha^{y1}, & \alpha^{y2} & \ldots & \ldots \alpha^{y14}, & 0, & 1 \end{pmatrix}$$

is still a parity matrix. Therefore, $$\alpha^{x1} \cdot W_1 + \alpha^{x2} \cdot W_2 \ldots \alpha^{x14} \cdot W_{14} + 1 \cdot P + 0 = 0$$

$$\alpha^{y1} \cdot W_1 + \alpha^{y2} \cdot W_2 \ldots \alpha^{y14} \cdot W_{14} + 0 + 1 \cdot Q = 0$$

Hence, the parity words P and Q can be calculated as $$P = \alpha^{x1} \cdot W_1 + \alpha^{x2} \cdot W_2 + \ldots + \alpha^{x14} \cdot W_{14}$$

$$Q = \alpha^{y1} \cdot W_1 + \alpha^{y2} \cdot W_2 + \ldots + \alpha^{y14} \cdot W_{14}$$

However, devices heretofore proposed for accomplishing the above-described principle of Reed-Solomon code generation require a costly ROM network and is disproportionately intricate in construction.

SUMMARY OF THE INVENTION

It is therefore an object of the present invention to provide a Reed-Solomon code generator which is usable for various purposes such as checking or correcting code errors in digital signals which are employed or digital signal recording/playback apparatuses.

It is another object of the present invention to provide a simple Reed-Solomon code generator which eliminates the need for expensive ROMs and has inexpensive registers as its major components.

It is another object of the present invention to provide a Reed-Solomon code generator which is feasible for integration.

It is another object of the present invention to provide a generally improved Reed-Solomon code generator.

A Reed-Solomon code generator of the present invention comprises a first modulo 2 adder supplied with an externally derived data word signal. A first register is supplied with an output of the first modulo 2 adder and first clock pulses and, in turn, supplies its output to the first modulo 2 adder. The first register is updated in response to every one of the first clock pulses to store a result of modulo 2 addition of the data word wignal and data stored in the first register just before the arrival of each clock pulse of the first clock pulses. A second modulo 2 adder is supplied with the data word signal which is received simultaneously by the first modulo 2 adder. A first multiplier multiplies an output of the second modulo 2 adder supplied thereto by a primitive root $\alpha$ of a predetermined generating polynomial. A second register is supplied with an output of the first $\alpha$ multiplier and second clock pulses and, in turn, supplies its input to the second modulo 2 adder. The second register is updated in response to every one of the second clock pulse to store a product of the primitive root $\alpha$ and a result of modulo 2 addition of the data word signal and data stored in the second register just before the arrival of each clock pulse of the second clock pulses, which is provided by the first $\alpha$ multiplier.

In accordance with the present invention, a Reed-Solomon code generator is applicable to a digital signal recording/playback apparatus to check or correct code errors in digital signals. The code generator eliminates the need for costly read only memory devices (ROM tables) and uses inexpensive registers, modulo 2 adders and multipliers instead.

The above and other objects, features and advantages of the present invention will become apparent from the following detailed description taken with the accompanying drawings.

DESCRIPTION OF THE PREFERRED EMBODIMENT

While the Reed-Solomon code generator of the present invention is susceptible of numerous physical embodiments, depending upon the environment and requirements of use, substantial numbers of the herein shown and described embodiments have been made, tested and used, and all have performed in an eminently satisfactory manner.

Figure 1:
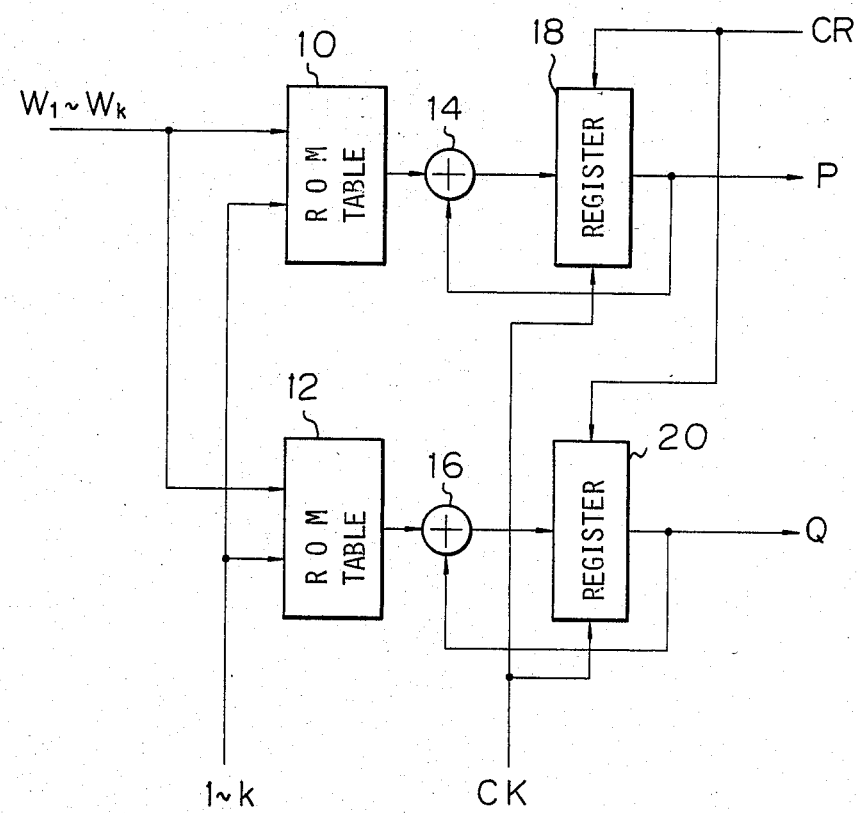
FIG. 1 is a block diagram of a prior art Reed-Solomon code generator.

Before entering into detailed discussion of the present invention, a brief reference will be made to a prior art apparatus for Reed-Solomon code generation, illustrated in FIG. 1. The Reed-Solomon code generator includes two read only memories (ROMs), or tables, 10 and 12 which are individually supplied with externally derived data words $W_1$-$W_k$ and signals 1-k. The outputs of the ROMs 10 and 12 are respectively delivered via modulo 2 adders 14 and 16 to registers 18 and 20. The register 18 generates a parity word P and the register 20, a parity word Q. The parity words P and Q are respectively fed back to the registers 18 and 20 via the modulo 2 adders 14 and 16. Commonly supplied to the registers 18 and 20 are a clearing signal CR and a clock signal CK. Thus, the prior art Reed-Solomon code generator requires, among others, a costly ROM network and is intricate in construction.

Now, assuming $$H_0 = \begin{pmatrix} h_0 \\ h_1 \end{pmatrix} = \begin{pmatrix} 1, & 1, & \ldots & \ldots 1, & 1 \\ \alpha^{15}, & \alpha^{14}, & \ldots & \ldots \alpha, & 1 \end{pmatrix}$$

$$H_0 = \begin{pmatrix} h_0 + h_1 \\ h_1 \end{pmatrix} = \begin{pmatrix} (\alpha^{15}+1)\ldots(\alpha+1), & 0 \\ \alpha^{15}, \alpha^{14} \ldots \ldots \alpha, & 1 \end{pmatrix}$$

there hold equations $$(\alpha^{15}+1)W_1 + \ldots + (\alpha^2+1)W_{14} + (\alpha+1)P = 0$$

$$\alpha^{15} \cdot W_1 + \alpha^{14} \cdot W_2 + \ldots + \alpha^2 \cdot W_{14} + \alpha \cdot P + Q = 0$$

Therefore, $$P = (\alpha+1)^{-1}\{(\alpha^{15}+1)W_1 + \ldots\}$$

$$Q = \alpha^{15} \cdot W_1 + \alpha^{14} \cdot W_2 + \ldots + \alpha \cdot P$$

That is, $$P = (\alpha+1)^{-1}\{\alpha^{15} \cdot W_1 + \alpha^{14} \cdot W_2 + \ldots + (W_1 + W_2 + \ldots + W_{14})\}$$

The above equation teaches that a Reed-Solomon code generator can be constructed simply without resorting to any ROM network.

Figure 2:
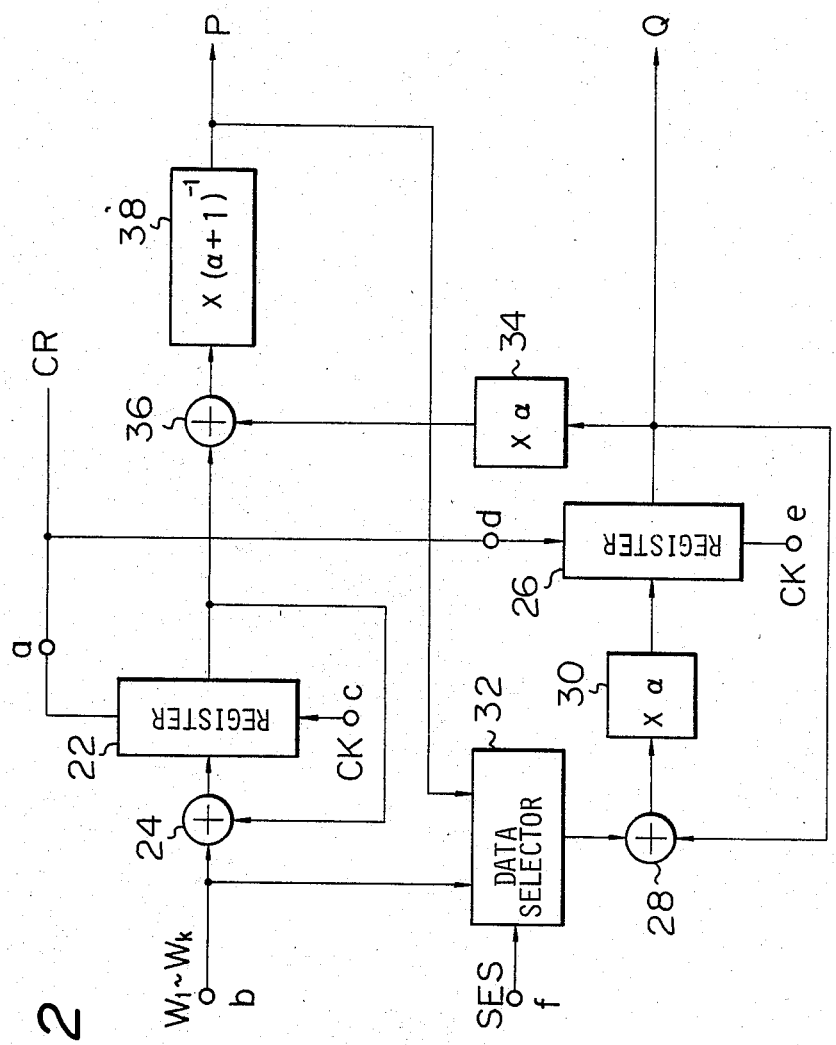
FIG. 2 is a block diagram of a Reed-Solomon code generator embodying the present invention.

Referring to FIG. 2, a Reed-Solomon code generator embodying the present invention will be described which realizes the principle stated above.

In FIG. 2, the Reed-Solomon code generator comprises a first register 22 having a first clearing signal input terminal a to which a clearing signal CR is supplied. The output of the first register 22 is fed to a first modulo 2 adder (exclusive-OR gate) 24 together with the code words $W_1$-$W_k$, which are supplied to an input terminal b. The output of the first modulo 2 adder 24 is delivered to the register 22. An arrangement is made such that, every time a clock pulse CK arrives at a clock input terminal c of the first register 22, the result of modulo 2 addition of a data word $W_1$-$W_k$ and data stored in the first register 22 just before the arrival of the pulse is newly stored in the register 22.

A second register 26 has a second clearing signal input terminal d which receives the previously mentioned clearing input signal CR. The output of the second register 26 is supplied to a second modulo 2 adder 28 together with the data words $W_1$-$W_k$. The output of this modulo 2 adder 28 is fed to the second register 26 via a first α multiplier 30, which is adapted to multiply the input by the primitive root α of a predetermined generating polynomial, e.g. $F(x) = x^8 + x^4 + x^2 + 1$. In the construction shown in FIG. 2, every time a clock pulse CK arrives at a clock input terminal e of the second register 26, the product of α and a result of modulo 2 addition of a data word $W_1$-$W_k$ and data stored in the second register 26 just before the arrival of the clock pulse is newly stored in the second register 26. In accordance with the above definition, F (α) is expressed as $$F(\alpha) = \alpha^8 + \alpha^4 + \alpha^3 + \alpha^2 1 = 0$$

In response to every clock pulse CK fed to the terminal c, the first register 22 is updated to store the result of modulo 2 addition of a data word $W_1$-$W_k$ and data stored in the first register 22 just before the arrival of the pulse. With this construction, there is obtained $$W_1 + W_2 + \ldots + W_k$$

The data words $W_1$-$W_k$ are supplied to the second modulo 2 adder 28 by way of a data selector 32 (e.g. TI type SN74LS157 or TI type SN74LS153) which is supplied with a select signal at an input terminal f thereof. It will be recalled that the adder 28 is also supplied with an output of the second register 26, while the register 26 is supplied with a clearing input signal CR at the terminal d. The first α multiplier 30, in response to an output of the adder 28, supplies the register 26 with a product of its input and the primitive root α of a predetermined generating polynomial such as $F(x) = x^8 + x^4 + x^3 + x^2 + 1$. In response to every clock pulse CK arriving at the clock input terminal e, the register 26 is updated to store an output of the α multiplier 30 which is a product of α and a result of modulo 2 addition of a data word $W_1$-$W_k$ and a content of the register 26 stored just before the arrival of the clock pulse. This construction provides $$\alpha^k \cdot W_1 + \alpha^{k-1} \cdot W_2 + \ldots + \alpha \cdot W_k$$

The output of the second register 26 is fed out to a second α multiplier 34 an output of which is in turn supplied to a third modulo 2 adder 36. Also supplied to the third modulo 2 adder 36 is an output of the first resister 22. The output of the adder 36 is delivered to an (α+1) multiplier 38 to provide a first parity word P.

The data selector 32 is switched to selectively supply the modulo 2 adder 28 with the data words $W_1$-$W_k$ and the first parity word P. The register 26, receiving clock pulses CK at the terminal e, calculates $$\alpha^{k+1} \cdot W_1 + \alpha^k \cdot W_2 + \ldots \alpha^2 \cdot W_k 30\, \alpha \cdot P$$

The output of the register 26 is a weighted second parity word Q as shown in FIG. 2.

Reed-Solomon codes corresponds to part of BCH (Bose-Chaudhuri-Hocquenghen) codes. The parity matrix $H_0$ for the BCH codes is written as $$H_0 = \begin{pmatrix} \alpha^{i+k+1}, & \alpha^{i+k}, & \ldots & \ldots, & \alpha^{i+1}, & \alpha^i \\ \alpha^{i+2(k+1)}, & \alpha^{i+2k}, & \ldots & \ldots & \alpha^{i+2}, & \alpha^i \end{pmatrix}$$

This may be rewritten as $$H_0 = \alpha^i \cdot \begin{pmatrix} \alpha^{k+1}, & \alpha^k, & \ldots & \ldots & \alpha, & 1 \\ \alpha^{2(k+1)}, & \alpha^{2k}, & \ldots & \ldots & \alpha, & 1 \end{pmatrix}$$

The Reed-Solomon code usually refers to the matrix $$H_0 = \begin{pmatrix} \alpha^{k+1}, & \alpha^k, & \ldots & \ldots & \alpha, & 1 \\ \alpha^{2(k+1)}, & \alpha^{2k}, & \ldots & \ldots & \alpha^2, & 1 \end{pmatrix}$$

Figure 3:
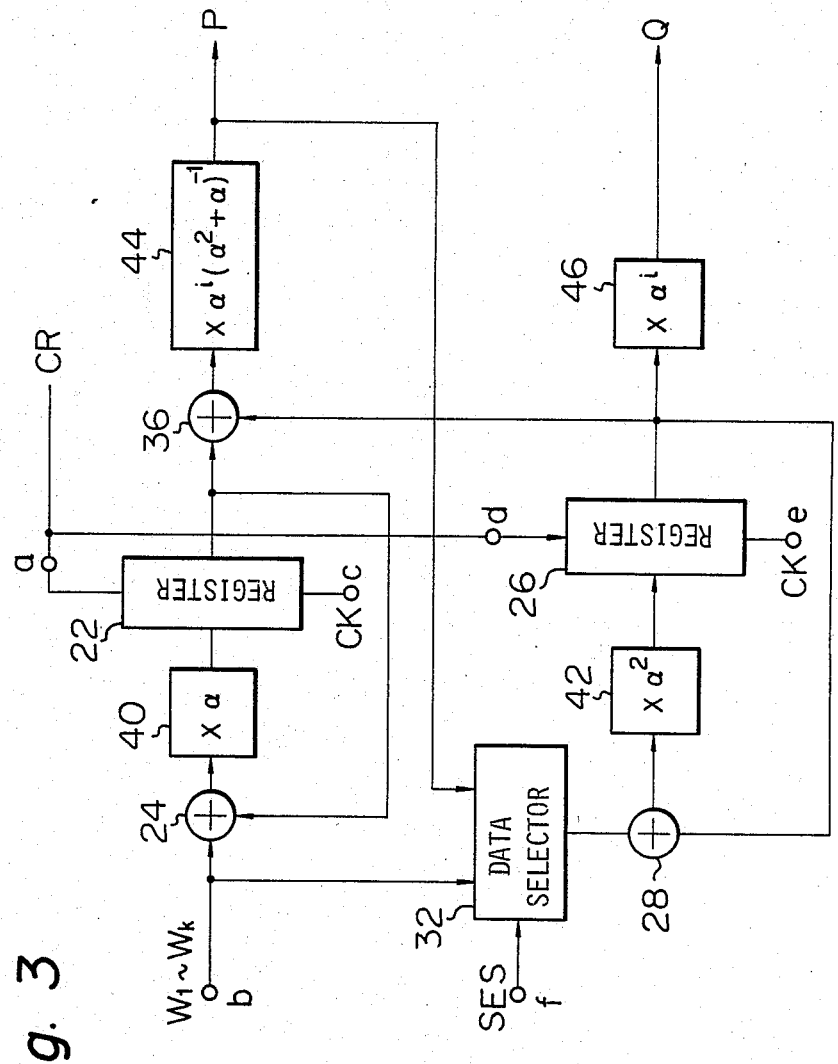
FIG. 3 is a block diagram of another embodiment of the present invention.

In accordance with the present invention, a circuitry for the generation of the generalized (k+2, k) BCH codes may also be accomplished. A Reed-Solomon code generator shown in FIG. 3 which includes multipliers 40, 42, 44 and 46 is attainable by modifying the matrix as $$H_0 = \alpha^i \cdot \begin{pmatrix} (\alpha^{2(k+1)} + \alpha^{k+1}) \ldots & \ldots (\alpha^2 + \alpha), & 0 \\ \alpha^{2(k+1)}, & \alpha^{2k} & \ldots & \ldots \alpha^2, & 1 \end{pmatrix}$$

In summary, it will be seen that the present invention provides a Reed-Solomon code generator which is economical and simple in construction due to the omission of ROMs (tables). The simple circuit construction facilitates integration of the circuit into a semiconductor chip and thereby production on a quantity basis which trims the costs. The Reed-Solomon code generator of the present invention finds various applications such as to a PCM recording/playback apparatus which processes audio, video and like information signals as digital signals using magnetic tapes or discs, and a circuit adapted to check or correct code errors in digital signal processing in other digital signal recording/playback apparatuses.

Various modifications will become possible for those skilled in the art after receiving the teachings of the present disclosure without departing from the scope thereof.

What is claimed is:

1. A Reed-Solomon code generator comprising:
   first modulo 2 adder means supplied with an externally derived data word signal;
   a first register supplied with an output of said first modulo 2 adder means and first clock pulses, an output of said first register being fed to the first modulo 2 adder means, the first register being updated in response to every one of the first clock pulses to store a result of modulo 2 addition of the data word signal and data stored in the first register just before the arrival of each clock pulse of said first clock pulses;
   second modulo 2 adder means supplied with the data word signal which is received simultaneously by the first modulo 2 adder means;
   first $\alpha$ multiplier means for multiplying an output of said second modulo 2 adder means supplied thereto by a primitive root $\alpha$ of a predetermined generating polynomial; and
   a second register supplied with an output of said first $\alpha$ multiplier means and second clock pulses, an output of said second register being supplied to the second modulo 2 adder means, the second register being updated in response to every one of the second clock pulses to store a product of the primitive root $\alpha$ and a result of modulo 2 addition of the data word signal and data stored in the second register just before the arrival of each clock pulse of said second clock pulses, which is provided by the first $\alpha$ multiplier means.

2. A Reed-Solomon code generator as claimed in claim 1, further comprising data selector means for delivering an output thereof to the second modulo 2 adder means, said data selector means being supplied with the data word signal which is received simultaneously by the first modulo 2 adder means.

3. A Reed-Solomon code generator as claimed in claim 2, further comprising second $\alpha$ multiplier means for multiplying the output of the second register by the primitive root $\alpha$.

4. A Reed-Solomon code generator as claimed in claim 3, further comprising third modulo 2 adder means supplied with the output of the first register and an output of the second $\alpha$ multiplier means.

5. A Reed-Solomon code generator as claimed in claim 4, further comprising $(\alpha+1)^{-1}$ multiplier means for producing a first parity word signal, said $(\alpha+1)^{-1}$ multiplier means being supplied with an output of the third modulo 2 adder means.

6. A Reed-Solomon code generator as claimed in claim 5, in which the first parity word signal is fed to the second modulo 2 adder means via the date selector means.

7. A Reed-Solomon code generator as claimed in claim 6, in which the second register produces a second parity word when supplied with the second clock pulse.

8. A Reed-Solomon code generator comprising:
   first modulo 2 adder means supplied with an externally derived data word signal;
   first $\alpha$ multiplier means for multiplying an output of said first modulo 2 adder means supplied thereto by a primitive root $\alpha$ of a predetermined generating polynomial;
   first register supplied with an output of said first $\alpha$ multiplier means and first clock pulses, an output of said first register being supplied to the first modulo 2 adder means, said first register being updated in response to every one of the first clock pulses to store a result of modulo 2 addition of the dara word signal and data stored in the first register just before the arrival of each clock pulse of said first clock pulses;
   second modulo 2 adder means supplied with the data word signal which is received simultaneously by the first modulo 2 adder means;
   $\alpha$ multiplier means supplied with an output of said second modulo 2 adder means; and
   a second register supplied with an output of said $\alpha$ multiplier means and second clock pulses, said second register being updated in response to every one of the second clock pulses to store a product of $\alpha$ and a result of modulo 2 addition of the data word signal and data stored in the second register just before the arrival of each clock pulse of said second clock pulses, which is provided by the $\alpha$ multiplier means.

9. A Reed-Solomon code generator as claimed in claim 8, further comprising data selector means for supplying an output thereof to the second modulo 2 adder means, said data selector means being supplied with the data word signal which is received simultaneously by the first modulo 2 adder means.

10. A Reed-Solomon code generator as claimed in claim 9, further comprising third modulo 2 adder means supplied with the output of the first register and the output of the second register.

11. A Reed-Solomon code generator as claimed in claim 10, further comprising $\alpha^i(\alpha^2+\alpha)^{-1}$ multiplier means for producing a first parity word signal, said $\alpha^i(\alpha^2+\alpha)^{-1}$ multiplier means being supplied with an output of the third modulo 2 adder means.

12. A Reed-Solomon code generator as claimed in claim 11, the first parity word signal is fed to the second modulo 2 adder means via the data selector means.

13. A Reed-Solomon code generator as claimed in claim 12, further comprising $\alpha^i$ multiplier means for producing a second parity word signal when the second register is supplied with the second clock pulse, said $\alpha^i$ multiplier means being supplied with the output of the second register.

* * * * *